United States Patent [19]
Guldi et al.

[11] Patent Number: 5,520,205
[45] Date of Patent: May 28, 1996

[54] APPARATUS FOR WAFER CLEANING WITH ROTATION

[75] Inventors: Richard L. Guldi, Dallas; Robert F. Kunesh, Plano, both of Tex.

[73] Assignee: Texas Instruments Incorporated, Dallas, Tex.

[21] Appl. No.: 269,737

[22] Filed: Jul. 1, 1994

[51] Int. Cl.⁶ .............................. B08B 3/12; B08B 11/02
[52] U.S. Cl. .................. 134/98.1; 134/102.1; 134/104.1; 134/111; 134/138; 134/186; 134/902
[58] Field of Search .................................. 134/902, 98.1, 134/102.1, 104.1, 111, 138, 139, 155, 165, 186, 191

[56] References Cited

U.S. PATENT DOCUMENTS

| | | | |
|---|---|---|---|
| 4,209,342 | 6/1980 | Workman | 134/139 X |
| 4,753,258 | 6/1988 | Aigo | 134/186 |
| 4,980,300 | 12/1990 | Miyashita et al. | 134/1 X |
| 5,090,432 | 2/1992 | Bran | 134/139 |

FOREIGN PATENT DOCUMENTS

| | | | |
|---|---|---|---|
| 69260 | 6/1979 | Japan | 134/139 |
| 257826 | 11/1991 | Japan | 134/902 |
| 55192 | 3/1993 | Japan | 134/902 |

*Primary Examiner*—Philip R. Coe
*Attorney, Agent, or Firm*—W. Daniel Swayze, Jr.; W. James Brady, III; Richard L. Donaldson

[57] ABSTRACT

A method and apparatus for a wafer cleaner using a rotation mechanism. Wafers are placed into a carrier 3 having grooves to maintain a spacing between the wafers. The carrier 3 and wafers are placed into a tank 1 with a cleaning solution. Nozzles 11 are used to direct pressurized solution against the wafers causing them to rotate within the carrier. In another embodiment, the tank 1 includes a megasonic transducer 16. In the second embodiment, the wafers are rotated while the megasonic transducer 16 is producing megasonic energy. The rotation of the wafers causes the cleaning solution and the megasonic energy to act on the wafers uniformly, and further exposes the edges of the wafers directly to the cleaning solution and the megasonic energy, thereby enhancing particle removal from the wafers. Other embodiments are provided.

12 Claims, 4 Drawing Sheets

APPARATUS FOR WAFER CLEANING WITH ROTATION

FIELD OF THE INVENTION

This invention generally relates to a method and apparatus for an improved wafer cleaner for use in fabricating wafers such as the semiconductor wafers used for integrated circuits and electronic devices.

CROSS REFERENCE TO RELATED APPLICATIONS

This application is related to U.S. patent application Ser. No. 08/269,717, filed Jul. 1, 1994, and titled "Rotational Megasonic Cleaner/Etcher for Wafers".

BACKGROUND OF THE INVENTION

Without limiting the scope of the invention, the background is described in reference to the wafer cleaning process steps in an integrated circuit production facility. Semiconductor devices are typically fabricated on a circular semiconductor substrate called a wafer. The circuitry for the electronic devices is fabricated on a wafer of semiconductor material using photolithography and vapor phase deposition techniques, and also selective etching techniques. Many electronic devices are produced on a single wafer. After the individual devices are completely fabricated, the wafer is cut into the individual die.

The wafers used in the fabrication of semiconductor devices are typically circular and quite thin. One problem which arises in producing circuitry on the circular wafers is that particulate matter which accumulates on the outer edge and the outer circumference of the wafer, in areas where no circuitry is defined, migrates into the areas where circuitry is being defined. Particles left on wafers will be redistributed during wafer processing and will move onto active die in the area of the wafer that is used for production. These particles cause defects in the circuitry being defined on the wafer. As device geometries continue to shrink, these particles will become larger compared with the device geometries and the defects will correspondingly be more critical. These defects result in nonfunctional electronic devices, which reduce the unit yield per wafer and correspondingly increase the cost of production per unit.

Known prior art cleaning systems use a cleaning solution in a tank coupled with a megasonic transducer to remove particulate matter from top and bottom interior surfaces of the wafers. These known systems fail to adequately address the problem of removing particulate matter from the outer edge and outer circumference of the wafers. In known systems, the wafers are placed in the tank of cleaning chemicals and the tank is excited by energy radiating from the megasonic transducer, which increases the rate of particle removal. Because the wafers are placed in the tank in a vertical orientation, some parts of the wafer are farther away from the megasonic energy source than others. Typically the transducer is located at the bottom of the tank and the energy radiates from it. This results in a nonuniform cleaning rate from the bottom of the wafers to the top. As wafers increase in size to accommodate larger circuits and increasing integration, these effects will increase in significance. Known cleaning systems correct for this nonuniform effect by using more processing time than that required at the areas closer to the transducer in order to extend the proper cleaning results to those areas farther away. In spite of this, the wafers are cleaned nonuniformly.

Additional particle problems arise because the wafers are stored in carriers or boats. In the megasonic processing tanks of the prior art, the wafers are placed into the tank while residing in a wafer boat. Each wafer rests within grooves that separate the wafers and prevent them from colliding as they are moved. The wafers are vertically oriented within the boat. The sides and a small portion of the bottoms of the wafers are therefore contacting the boat. These surfaces are not cleaned efficiently by the megasonic processing tanks of the prior art, because they are essentially dead spots. Particles trapped in these places are not effectively removed because the megasonic energy is partially blocked and because the particles are trapped between the wafers and the boat. Another area of the wafers that is not well cleaned by the cleaner configurations of the prior art is the top edge of the wafers. The tops edges of the wafers facing away from the transducer do not receive direct line of sight megasonic energy and therefore are not cleaned as effectively as the bottom edge. Particles left in these places will migrate to the active areas of the wafer and become particle defects in the wafer when the wafer is further processed.

Some known systems move wafers about in the tanks during cleaning but none address the problem associated with nonuniform exposure to the megasonic energy source or the spaces between the wafer edge and the boats. Prior art approaches include moving the boats from side to side with a mechanism in the tank or using a robot arm to move the carrier during processing. These approaches risk additional particle contamination within the tank by introducing additional surfaces into the tank. Further, using the robot arms in automated process flows to move the wafers and boat could require that the robot arm move the wafers during the entire megasonic processing cycle, which ties up the robot arm and decreases overall process flow throughput. The robot arm is typically used for many tasks, including moving the wafers into the megasonic tank. If the robot arm is required to stay in place throughout the megasonic cycle, the overall throughput of the system is decreased. Other tasks for the robot arm are now required to be deferred until after the megasonic processing is completed.

The nonuniform results of known prior art megasonic processes are detectable with current technology wafers of 4 or 6 inches, and will become even more pronounced with 8 inch or larger wafers as the standard. Larger wafers are being contemplated, which will make particle defects more critical still. The invention of this application addresses the nonuniform cleaning rates and the extended processing times for obtaining acceptable results with prior art megasonic cleaning and etching systems, and the particles left in place in prior art wafer cleaning and etching systems.

SUMMARY OF THE INVENTION

Generally, and in one form of the invention, an improved wafer cleaner is described which features a wafer rotation system. Wafers are loaded into a standard wafer carrier, or boat, which has grooves separating the wafers and supports the wafers at their edges while exposing the bottom and tops of the wafers. Solution for processing the wafers is added to a processing tank. The carrier and wafers are loaded into the tank and the wafers and carrier are immersed in the solution. In a preferred embodiment the tank contains a megasonic transducer, but some solutions will operate with the invention without a transducer. Nozzles located along the bottom of the tank are used to direct the pressurized solution or a pressurized inert gas at the wafers at an angle designed to cause the wafers to rotate within their position in the carrier. If present, the megasonic transducer is activated. The rotation of the wafers ensures that each wafer is uniformly exposed to the solution and the megasonic energy of the transducer during the processing time. The solution is recirculated and filtered to remove particles from the solution. The rotating wafers experience a uniform cleaning rate due to the rotation which exposes all surfaces to the solution and also to the energy directly above the megasonic source.

After a rotation cycle, a second set of nozzles designed to produce a vertical laminar flow is used to force any loose particulate which resides in the tank upwards and over the side of a weir in tank in which the carrier or boat rests. The particles are then collected by the recirculating pump and trapped in the filter. The wafer rotation cycle can then be repeated to remove more particles. The processing tank of the invention can also be used to clean particles from empty wafer carriers to further reduce the particles in a process flow. The nozzles are directed at the grooved sides of the empty wafer carrier where particles are likely to become deposited with use of the wafer carrier, the megasonic transducer is activated and the carrier is thereby cleaned. Again, the megasonic transducer is preferred, but not required. Other embodiments are described as well.

DETAILED DESCRIPTION OF PREFERRED EMBODIMENTS

A first preferred embodiment wafer cleaning device is a wafer carrier and a processing tank. A megasonic transducer is preferably placed in the tank but not required. This system can be used to clean wafers and for processing steps used in fabricating semiconductor devices. Typical processing steps where the preferred embodiment can be used include general wafer cleaning, local interconnect wet etch processing, and excess Ti/TiN strip after $TiSi_2$ silicide formation. During the cleaning or processing step, the wafers are rotated inside the wafer carrier by directing pressurized solution through nozzles directed at an angle to the bottom edge of the wafers. This rotation enhances the efficiency and uniformity of the cleaning action because all of the areas of the wafers are exposed to the solution and to the energy from the megasonic transducer within the cleaning tank in a uniform manner, so that a uniform clean rate occurs. The rotation moves the wafers within the grooves in the carrier, so that areas otherwise blocked off from the megasonic energy are all exposed directly to the transducer.

A second preferred embodiment wafer cleaner and carrier includes a rotational cleaning tank which has a pressurized gas source coupled to the rotational nozzles for an enhanced particle removal system. In this embodiment, a filter and pump are used for laminar flow, and a inert gas system is used to rotate the wafers. After the wafers are rotated in the solution for a time, it is expected that particles will be dislodged and will be present in the tank. The rotation nozzles are deactivated and the laminar flow nozzles are activated to displace any particles away from the bottom of the tank and grooves of the boats, and upwards over a weir within the tank. Once the particles are lifted over the weir, the recirculation pump and filter are used to remove the particles from the solution. Preferably a megasonic transducer is included, and again the rotation action uniformly exposes the wafers to the energy from the megasonic transducer. If desired, additional rotation and laminar flow cycles can then be applied to the wafers to achieve the level of particle removal desired for a particular process flow.

Figure 1:
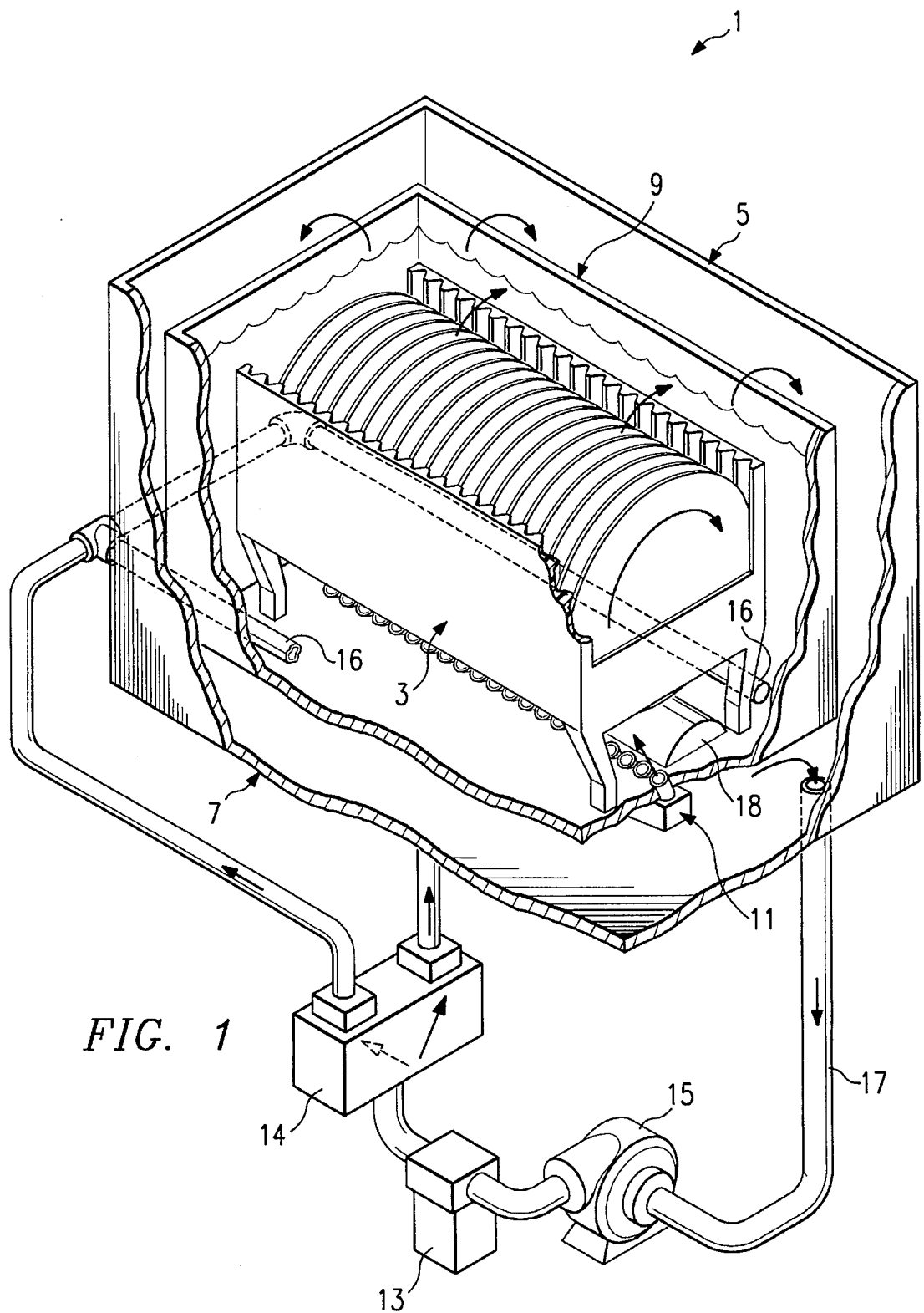
FIG. 1 depicts a first view of a first embodiment of the rotational wafer cleaner of the invention.

FIG. 1 depicts a first view of the processing tank 1 of the preferred embodiment. The wafer carrier 3 is a preferably a known wafer carrier or boat which is open at the top and bottom and separates the wafers by grooves. One wafer could be cleaned using the system of the invention, but typically economies of scale dictate batches of wafers are cleaned to take advantage of the chemicals and solutions. Other wafer carriers could be used so long as the carriers are open at the top and bottom and the wafers can freely turn within the carrier. Tank 1 comprises sides 5, bottom 7, weir 9, nozzles 11, filter 13, pump 15, recirculation inlet 17, valve 14, and recirculation jets 16. Megasonic transducer 18 is preferably included, but the invention will operate and advantageously clean the wafers without it.

Tank 1 is preferably rectangular in shape, but other shapes are possible alternatives so long as they will receive the boat 3. Weir 9 is a rectangular area within tank 1 and having sides that are taller than the top of the wafers resting in the wafer carrier 3, but lower than the sides of tank 1. Weir 9 could also take other shapes so long as the boat or carrier 3 will fit within it. A megasonic transducer 18 is optionally located on the bottom of weir 9. Alternatively, the transducer 18 could be located at the bottom of tank 1. The transducer is a source of megasonic energy, usually classified as energy in the range of 800 kHz to 2–3 MHZ. Recirculation jets 16 are located at the bottom corners of weir 9, in the preferred embodiment shown here two jets are used, but more or less are feasible alternatives. Valve 14 is used to direct the pressure from pump 15 to either recirculation jets 15 or rotation nozzles 11.

In operation, a cleaning or processing solution is added to the tank 1 and fills weir 9. This may be accomplished by fill and recirculation nozzles 16 located within the tank, by an inlet line coupled to pump 17, or by an external nozzle means. Once weir 9 is filled with the solution for the particular processing step, boat or carrier 3 is loaded with wafers and introduced into the tank and immersed in the solution in weir 9. If megasonic transducer 18 is included, the megasonic transducer 18 is activated to emit megasonic energy towards the wafers.

Pump 15 is now used to drive pressurized solution taken from solution inlet 17 out through filter 13 and nozzles 11. Valve 14 directs the pressurized solution to nozzles 11 during this operation. The pressure should be high enough to create a sufficient force to begin rotation of the wafers in boat 3. Rotation rates of approximately 2 revolutions per minute have been observed using a pump and filter having a flow rate of 3–4 liters/minute and using nozzles ¼" in diameter, with wafers that are 150 mm in diameter. The nozzles 11 are angled to the wafer, the most effective angles observed were 20–40 degrees. A tangential flow also produced rotation with sufficient pressure. A high rate of rotation is not required so long as the wafers are moved so that the outside edge of each wafer is exposed directly to the solution and, if present, to transducer 18 and the megasonic energy. This is important because the boat 3 material blocks the megasonic energy, and fluid flow, to those areas of the wafer which are not directly above the transducer. The edges of the wafers are particularly important, because the edges are typically not polished and are therefore more likely to trap particles. By rotation the entire outside edge of each wafer is directly exposed to the energy output by the transducer, and the wafers are moved in the grooves or the boat, which should disturb particles resting between the wafer and the grooved areas of the boat, so that both the boat and the wafers are simultaneously cleaned. Alternatively, the wafers could be rotated in a stepwise fashion. This alternative involves using pump 15 and nozzles 11 to move the wafers a predetermined part of a rotation, then allowing them to rest, then repeating the cycle until the entire area of the wafer is exposed directly to the energy from the megasonic energy source.

While the high pressure nozzles 11 will rotate the wafers, they also will create eddy currents within the tank. These currents will create dead spots in the tank 1 generally at the bottom of weir 9. Particles removed from the wafers which are not pushed out of the weir 9 into tank 1 will tend to accumulate in the center of the bottom of weir 9. It is important that these particles be removed from the solution before the wafers are removed from the tank.

Once the cleaning cycle has taken place for a predetermined time, the rotation nozzles 11 will be deactivated. Valve 14 is now moved to its second position. Pump 15 and filter 13 are now used to drive the recirculation jets 16. As an alternative, two separate pump and filter combinations could be used, one for laminar flow and one for rotational flow. Recirculation jets 16 provide a low pressure flow which extends throughout the weir 9 and moves particles which have accumulated on the bottom of the tank upwards and over the top edge of weir 9. After being pushed out of the weir 9 the particles will be drawn into inlet 17 and trapped within the filter media in filter 13. It is important to perform this step with the wafers in place so that the particles are removed before the wafers are removed from the tank 1. If the wafers are removed before the particle removal cycle is performed the particles will tend to be redeposited on the wafers, most of the redeposition occurring at the surface of the tank due to surface tension effects. To be most effective pump 15 may require two speeds, a high pressure speed for driving the rotation nozzles 11, and a lower pressure speed for driving the laminar flow recirculation jets 16. It is important that the laminar flow jets 16 be operated at a lower pressure to create an upwards lift without producing any eddy currents, which tend to trap particles. An iterative cycle of wafer rotation, followed by laminar flow, followed by wafer rotation, could be employed to achieve the desired level of particle removal. If two pumps are used, the laminar flow jets 16 are preferably left on continuously while the rotational nozzles are cycled on and off.

Various solutions can be used in the megasonic processing tank, depending on the stage of the wafer processing. Before any deposition is made on the wafer, a solution of $NH_4$, $H_2O_2$ and water is an excellent choice for particle removal. Deionized water can be used once structures which are vulnerable to cleaning chemicals and acids have been deposited upon the wafer, however its effectiveness is limited by high surface tension and the fact that it does no etching. For other stages, other solutions are used. Typical solutions which may be used include so called piranha solutions, solutions of sulfuric acid, $H_2SO_4$ and peroxide $H_2O_2$ in water, solutions comprised of ammonia and hydrogen peroxide, $NH_4OH$ and $H_2O_2$ in water, solutions including hydrogen fluoride, HF, buffered solutions including buffered HF solutions, solutions of hydrochloric acid and hydrogen peroxide, solutions of phosphoric acid and other alternatives for these are all suitable for certain stages of wafer processing. If the megasonic transducer is used, the megasonic energy speeds up the action of the cleaner solution and thereby improves particle removal. However, many solutions are effective in the absence of megasonic energy. To remove nitride, for example, a high temperature phosphoric acid bath is used. Rotation of the wafers exposes areas otherwise hidden by the boats and thereby improves particle removal.

Alternative configurations of nozzles 11 could be used in the embodiment shown in FIG. 1. Experimental use has demonstrated that an increased rate of rotation is achieved when the nozzles are pointed not just directly at the bottom edge of the wafers, but also angled to the faces of the wafers so that the pressurized solution contacts the backside surface as well as the wafer edge. FIG. 1 depicts a plurality of nozzles, each directed at one of the wafers. This embodiment could further be enhanced by providing another valve system coupled to the nozzles 11 so that only one or a small group of the nozzles is active at one time. By splitting the rotation of the wafers up into groups, a lower volume pump could be used with good effect, so long as the pressure directed at the wafer or wafers being rotated is sufficient.

Figure 2:
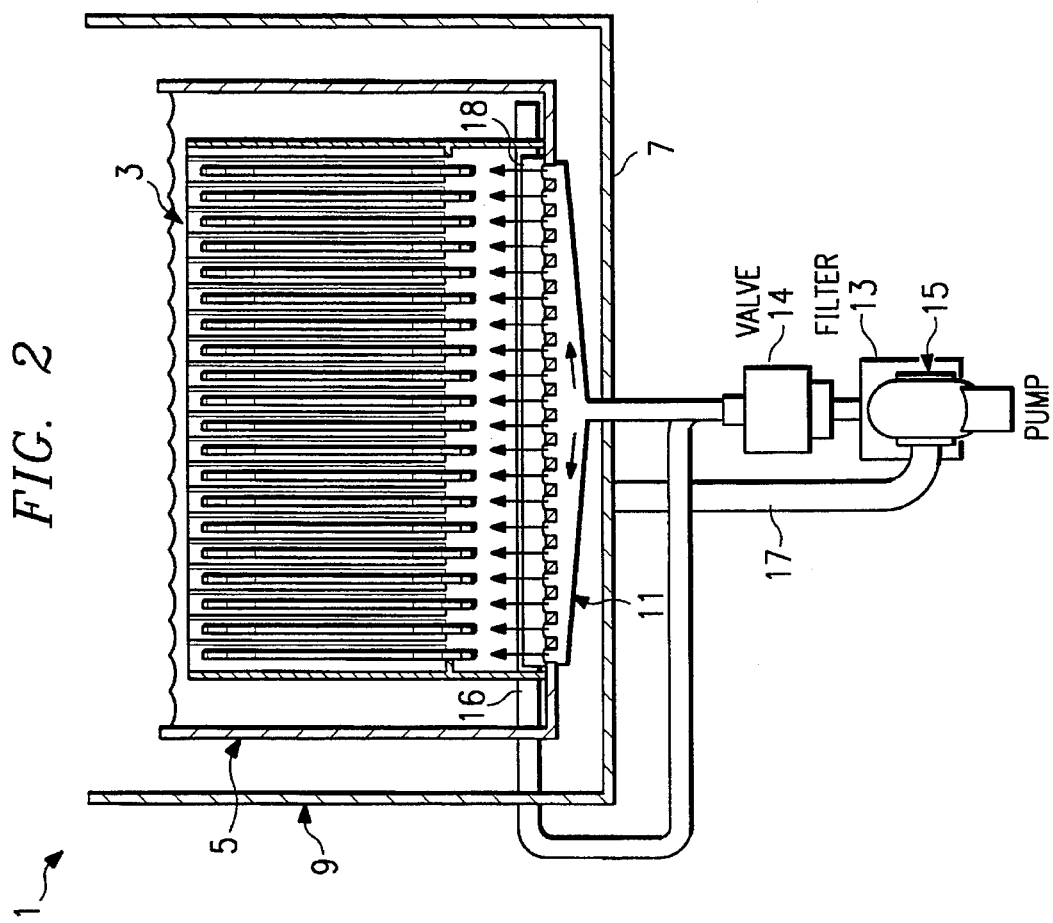
FIG. 2 depicts a second view of the rotational cleaner of the invention.

FIG. 2 depicts a side view of one embodiment of the processing tank of FIG. 1, and again having sides 5, weir 9, filter 13, pump 15, inlet 17, bottom 7, boat 3, nozzles 11, recirculation jets 16, valve 14 and showing optional megasonic transducer 18. FIG. 2 shows a funnel shaped member directed at all of the wafers in boat 3 through slots or openings which make up nozzles 11. This is a simple means to provide the nozzles 11. Alternatives which will also provide the advantages of the invention include a valved multiple nozzle system as discussed above, where individual or small groups of nozzles are ganged together, or splitting up the single funnel and nozzle system of FIG. 2 into two or three funnels and nozzles to reduce the maximum load on pump 15.

Figure 3:
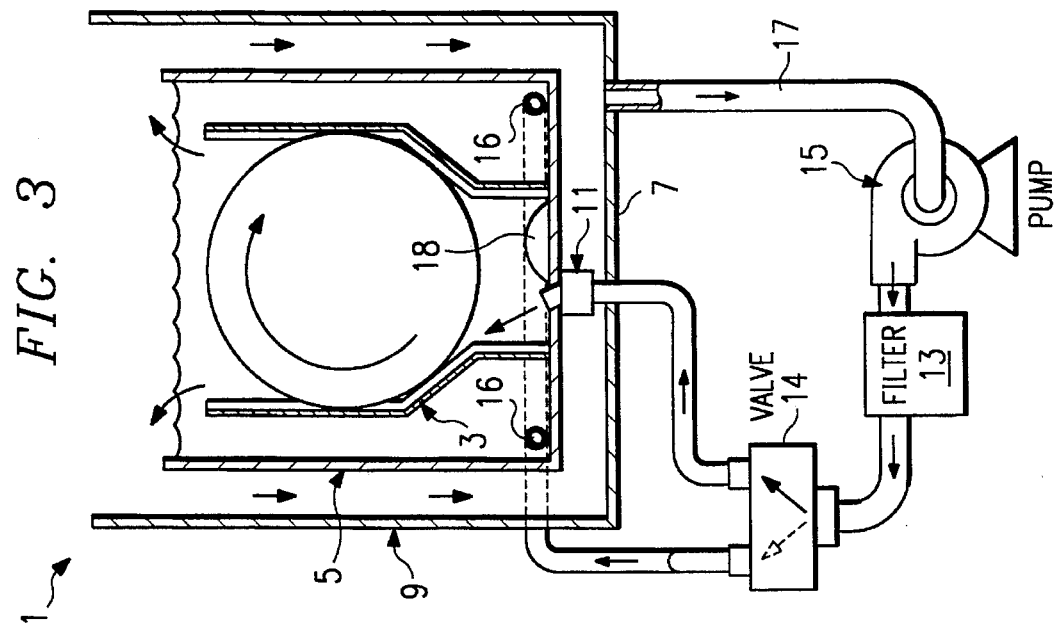
FIG. 3 depicts a third view of the rotational cleaner of the invention.

FIG. 3 depicts an end view of the processing tank 1 of FIG. 1 or FIG. 2. Again, pump 15, filter 13, inlet 17, and nozzle 11 are shown in tank 1 which has bottom 7, sides 5, and weir 9. Boat 3 is shown and the arrows indicate the flow of solution within the tank. Megasonic transducer 18 is located at the inside surface of weir 9. Recirculation jets 16 are located in the bottom corners of weir 9.

In the embodiment where the megasonic transducer is used, the transducer 18 is long enough to radiate energy at each of the wafers while the rotation takes place. The rotation of the wafers over the transducer is an improvement over the prior art megasonic tanks, where there are areas of the wafers which are never directly exposed to the megasonic energy. The boat 3 is open at the bottom so that the edges of the rotating wafers are directly exposed to transducer 18.

Figure 4:
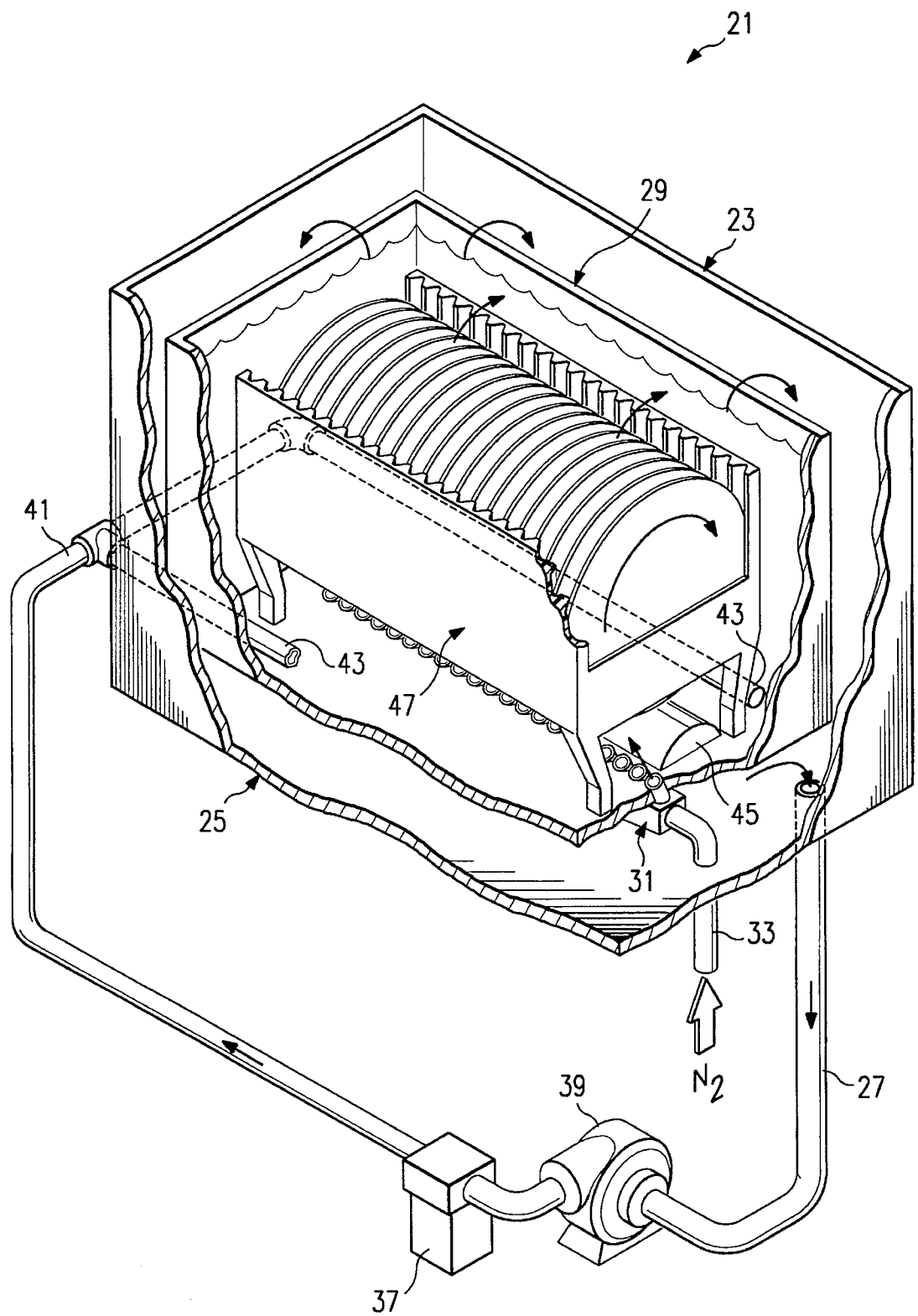
FIG. 4 depicts a first view of a second preferred embodiment of rotational cleaner of the invention.

FIG. 4 depicts a view of another preferred embodiment. Tank 21 comprises sides 23, bottom 25, weir 29, filter 37, pump 39, recirculation inlet 27, carrier 47, recirculation inlet 41 coupled to laminar flow jets 43, all arranged as before, and inlet 33 which is coupled to nozzles 31. A high pressure gas source, such as the nitrogen gas typically available in wafer processing areas, is coupled to inlet 33. Optional transducer 45 is shown at the bottom of weir 29.

Figure 5:
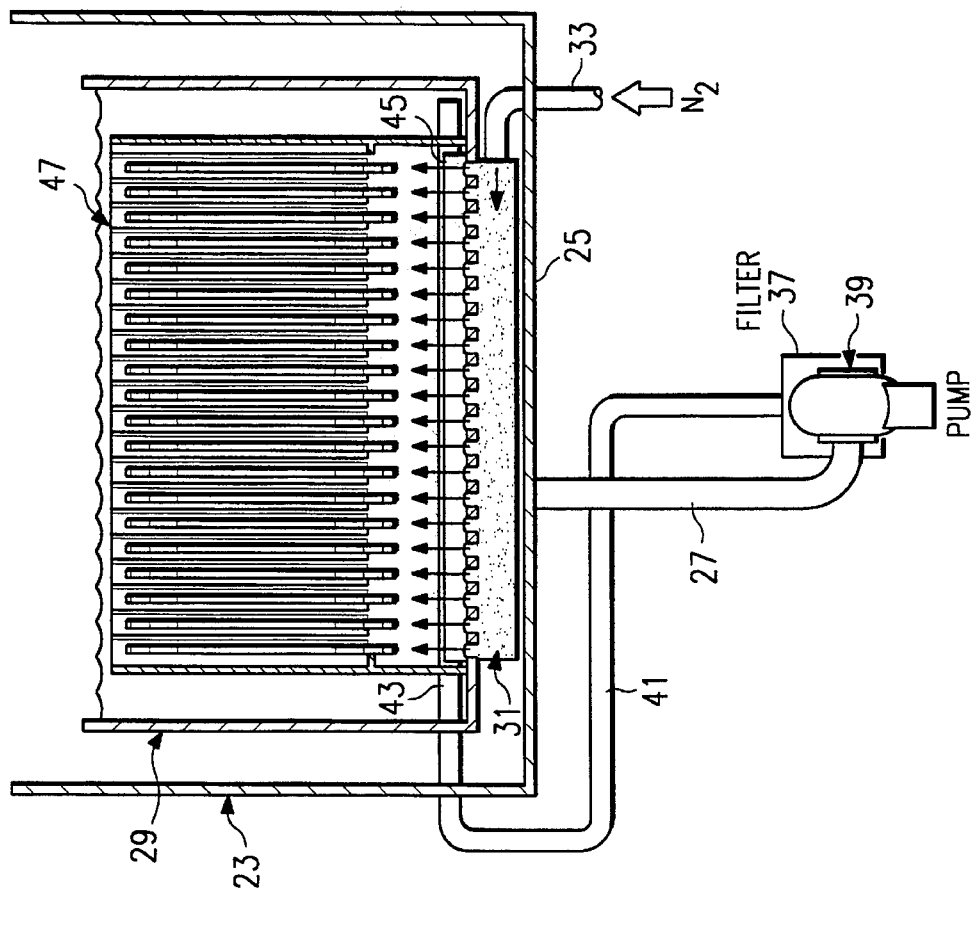
FIG. 5 depicts a second view of the rotational cleaner of FIG. 4.

FIG. 5 depicts a side view of the preferred embodiment of FIG. 4. Tank 21 again comprises sides 23, bottom 25, weir 29, recirculation inlet 27, nozzles 31, gas inlet 33, filter 37, pump 39, recirculation inlet 41 coupled to laminar flow jets 43, and boat 47. Optional transducer 45 is also depicted.

Figure 6:
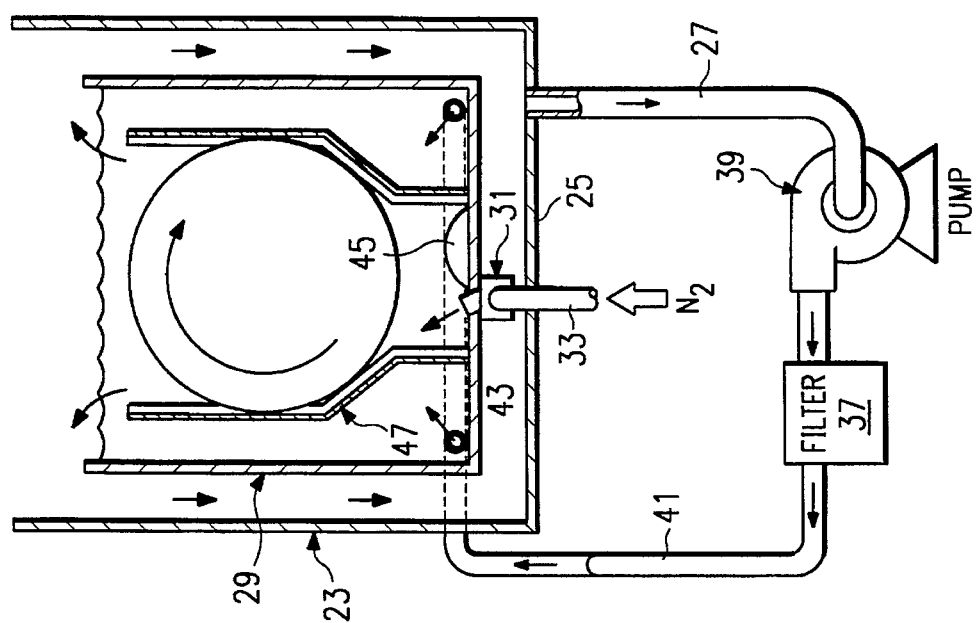
FIG. 6 depicts a third view of the rotational cleaner of FIG. 4.

FIG. 6 depicts an end view of the preferred embodiment of FIGS. 4 and 5. The elements and numbers are common to those shown in FIGS. 4 and 5.

In operation, the preferred embodiment of FIGS. 4, 5 and 6 operates in much the same manner as the embodiment of FIG. 1. Cleaning or processing solution is added by means of recirculation and laminar flow jets 43, coupled to pump 39 and filter 37 by inlets 41, or by other means. Recirculation fluid is taken from inlet 27 and filtered through filter 37 as before. A wafer carrier 47 is inserted in the tank 21. Megasonic energy is applied by transducer 45 if the transducer is used. The wafers are rotated, however now not by operation of the pump 39, but instead by use of the high pressure gas which feeds nozzles 31 from inlet 33. This arrangement has several advantages. First, it allows the pump 39 and filter 37 to have a single speed. No valves or controls are needed to direct the flow from pump. Also, the embodiment of FIGS. 4, 5 and 6 can operate with the laminar flow system always enabled, and the rotation cycle can be continuous or it can be cycled on and off, whichever method gives better particle control results for a particular wafer size. By leaving the pump 39 and laminar flow jets 43 always on, the need for control of pump 39 is eliminated. The weir 29 will still retain particles during the rotation cycles, therefore it is preferred that after the wafers are rotated over the megasonic transducer 45 by gas being inlet through nozzles 31 through inlet 33, the rotation cycle be stopped and a recirculation cycle is performed. In the recirculation cycle, laminar flow jets 43 give a low pressure laminar lift to lift trapped particulate over the top of weir 29 and the particulate is then drawn into inlet 27, the solution is then recycled by pump 39 through filter 37 and is thus filtered as before. This cycle should operate for several minutes until the desired level of particle removal is reached, and only then should the wafers be removed from the tank.

The gas being input to inlet 33 can be any inert or nonreactive gas, usually pressurized nitrogen is readily available in a wafer processing facility and is therefore preferred. Other driving agents, such as pressurized deionized water are also typically readily available and could be used instead of the gas.

Any of the embodiments described above can also be easily adapted to use as a boat cleaning tank. By directing the flow from the nozzles at and up the grooves in the boats, particles could be removed from empty boats and the megasonic energy, now not impeded by the wafers, will reach the grooves of the boats. These boats can then be used subsequently without introducing additional particles to new wafers to be processed.

All of the embodiments described herein provide for efficient use of the solutions by enhancing the efficiency of particle removal from the solution and the wafers, so that the solutions may be used for several batches of wafers before new solution is needed. This reduces the cost of production and also minimizes the amount of chemical disposal required.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An apparatus for processing at least one semiconductor wafer, comprising:

a tank filled with a solution;

a wafer carrier disposed within said tank and having supports for holding said at least one semiconductor wafer;

nozzle means within said tank for directing pressurized solution at said at least one semiconductor wafer; and said at least one semiconductor wafer being forced to rotate by said pressurized solution from said nozzle means.

2. The apparatus of claim 1, and further comprising:

a megasonic transducer disposed within said tank and beneath said wafer carrier, such that while said at least one semiconductor wafer is rotating it is exposed to megasonic energy thereby removing particles from said at least one semiconductor wafer.

3. The apparatus of claim 1, and further comprising:

a rectangular weir disposed within said tank for receiving said wafer carrier, the weir being spaced above the bottom of said tank and having inlets coupled to said nozzle means, the weir having a top lower than the top of said tank.

4. The apparatus of claim 3, wherein said solution comprises a cleaning solution.

5. The apparatus of claim 4, wherein said cleaning solution comprises a solution of $NH_4OH$ and $H_2O_2$ in water.

6. The apparatus of claim 3, and further comprising:

a pump coupled to said nozzle means; and an opening at the bottom of said tank for returning said solution to said pump, said opening being outside of said weir so that particles removed from said at least one semiconductor wafer and pushed over the top of said weir will travel into said opening.

7. The apparatus of claim 6, and further comprising:

a filter coupled to said pump for removing particles from said solution before the solution enters said tank through said nozzle means.

8. An apparatus for processing at least one semiconductor wafer, comprising:

a tank filled with a solution;

a wafer carrier disposed within said tank and having supports for holding said at least one semiconductor wafer;

nozzle means within said tank for directing pressurized solution at said at least one semiconductor wafer;

said at least one semiconductor wafer being forced to rotate by said pressurized solution from said nozzle means;

a pump coupled to said nozzle means;

an opening at the bottom of said tank for returning said solution to said pump, said opening being outside of said weir so that particles removed from said at least one semiconductor wafer and pushed over top of said weir will travel into said opening;

a filter coupled to said pump for removing particles from said solution before the solution enters said tank through said nozzle means; and a plurality of laminar flow jets in said weir coupled to said pump, for creating a laminar upward flow within said weir to push particles upwards over the top of said weir.

9. The apparatus of claim 8, and further comprising:

control valve means to direct pressurized solution to said nozzles and alternatively to said laminar flow jets, so that after causing said at least one semiconductor wafer to rotate for a predetermined time the pump can cause said laminar flow jets to create an upwards laminar flow within said weir.

10. The apparatus of claim 9, wherein said control valve means alternately directs said pressurized solution to said nozzles and to said laminar flow jets, alternating cycles being used to achieve a desired level of particle removal.

11. An apparatus for processing at least one semiconductor wafer, comprising:

a tank filled with a solution;

a wafer carrier disposed within said tank and having supports for holding said at least one semiconductor wafer;

nozzle means within said tank for directing pressurized solution at said at least one semiconductor wafers, and said at least one semiconductor wafer being forced to rotate by said pressurized solution from said nozzle means, wherein said nozzles are directed at an angle to said at least one semiconductor wafer so that the pressurized solution strikes both the outside edges and the faces of said wafer to achieve a rotational force.

12. The apparatus of claim 1, wherein said nozzles means are coupled to an inlet for pressurized gas, the pressurized gas being used to drive the solution and thereby rotate said at least one semiconductor wafer.

* * * * *